(12) United States Patent
Goldowsky et al.

(10) Patent No.: US 6,208,512 B1
(45) Date of Patent: Mar. 27, 2001

(54) CONTACTLESS HERMETIC PUMP

(75) Inventors: Michael Philip Goldowsky, Valhalla; George Liang-Tai Chiu, Cross River; Lawrence Shungwei Mok, Brewster; Arthur W. Ellis, Pleasantville, all of NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/312,298

(22) Filed: May 14, 1999

(51) Int. Cl.[7] ....................................... H05K 7/20
(52) U.S. Cl. .................. 361/699; 165/104.33; 310/104; 361/687; 417/420
(58) Field of Search ...................... 417/420, 366, 417/372, 410.3; 310/103, 104; 384/114, 115, 292, 313, 316; 257/714; 62/259.2; 165/80.3, 80.4, 104.33, 104.34; 361/687, 690, 695–699, 717–719

(56) References Cited

U.S. PATENT DOCUMENTS

| | | | |
|---|---|---|---|
| 3,299,819 | * | 1/1967 | McCoy . |
| 4,184,090 | * | 1/1980 | Taiani . |
| 5,292,284 | * | 3/1994 | Denk . |
| 5,441,102 | * | 8/1995 | Burward-Hoy . |
| 5,473,508 | * | 12/1995 | Porter . |
| 5,713,670 | * | 2/1998 | Goldowsky . |
| 5,731,954 | * | 3/1998 | Cheon . |
| 5,823,005 | * | 10/1998 | Alexander . |
| 5,924,975 | * | 7/1999 | Goldowsky . |
| 6,029,742 | * | 2/2000 | Burward-Hoy . |

* cited by examiner

*Primary Examiner*—Gerald Tolin
(74) *Attorney, Agent, or Firm*—Francis L. Conte

(57) ABSTRACT

A hermetic pump includes a housing having a bore, an inlet, and an outlet for channeling a fluid therethrough. A shaft is disposed coaxially in the bore, and includes a journal and an impeller spaced apart therefrom. The shaft is hermetically rotated to pump the fluid through the bore from the impeller and around the journal for developing a hydrodynamic journal bearing. In one embodiment, the pump may be used in a closed loop cooling circuit.

14 Claims, 3 Drawing Sheets

CONTACTLESS HERMETIC PUMP

BACKGROUND OF THE INVENTION

The present invention relates generally to cooling systems, and, more specifically, to hermetically sealed cooling systems with pump driven coolant therein.

Personal computers include a main circuit board, or mother board, having a central processing unit (CPU) in the form of a microprocessor chip. As these main processing chips increase in complexity and processing speed, they generate more and more heat during operation. This heat must be suitably dissipated to protect the processor from thermal damage.

Heat dissipation is typically provided in personal and laptop computers by introducing an air fan inside the computer cabinet for circulating ambient air over the processor for removing heat therefrom by convection. The processor may include radiator fins for increasing the available surface area from which heat may be withdrawn from the processor.

Air cooling of processor chips has been effective for low power computers having limited heat dissipation requirements. However, as the processors improve in capability the corresponding heat dissipation requirements therefor also increase. About 5 watts of heat energy is typical in a low power computer chip, with heat dissipation up to about 150 watts being required for high power computer chips being developed. And, kilowatts of cooling are required for multiprocessor computer servers using many chips.

In view of the critical use often found in computer systems, reliability of the entire system is a paramount design objective. Not only must the computer itself operate without failure, but the cooling system therefor must also operate without failure for a suitably long useful life. Since cooling fans have rotating components, they are subject to wear which can lead to fan failure. High reliability fans are typically more expensive than low reliability fans and affect the overall cost of the computer and its competitiveness.

Accordingly, it is desired to provide an improved cooling system for a computer having a hermetically sealed fluid pump therein.

BRIEF SUMMARY OF THE INVENTION

A hermetic pump includes a housing having a bore, an inlet, and an outlet for channeling a fluid therethrough. A shaft is disposed coaxially in the bore, and includes a journal and an impeller spaced apart therefrom. The shaft is hermetically rotated to pump the fluid through the bore from the impeller and around the journal for developing a hydrodynamic journal bearing. In one embodiment, the pump may be used in a closed loop cooling circuit.

BRIEF DESCRIPTION OF THE DRAWINGS

The invention, in accordance with preferred and exemplary embodiments, together with further objects and advantages thereof, is more particularly described in the following detailed description taken in conjunction with the accompanying drawings in which.

DETAILED DESCRIPTION OF THE INVENTION

Figure 1:
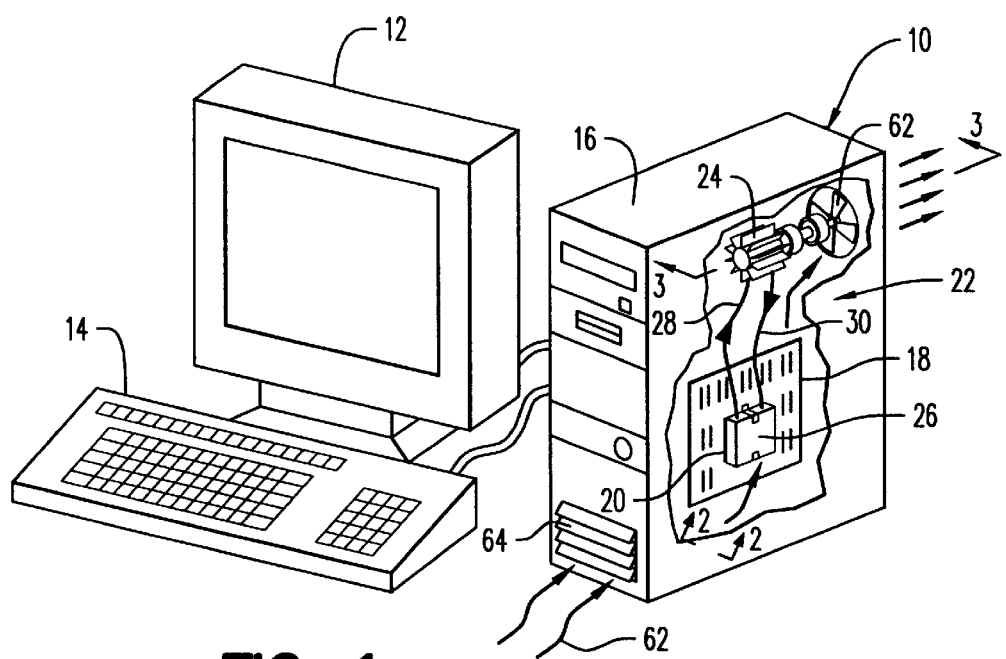
FIG. 1 is a partly sectional, isometric view of a personal computer including a main processor chip fluid cooled in accordance with an exemplary embodiment of the present invention.

Illustrated in FIG. 1 is an exemplary digitally programmable computer 10 in the exemplary form of a personal computer operatively joined to a monitor 12 and keyboard 14. The computer may have other forms, such as a laptop computer, for example.

The computer includes a suitable cabinet 16 in which its various operating components are housed including a main processor board 18, or mother board, which cooperates with various peripherals such as the monitor 12, keyboard 14, hard drive, CD drive, and floppy disk drive, for example, all powered by a suitable power supply therein.

Figure 2:
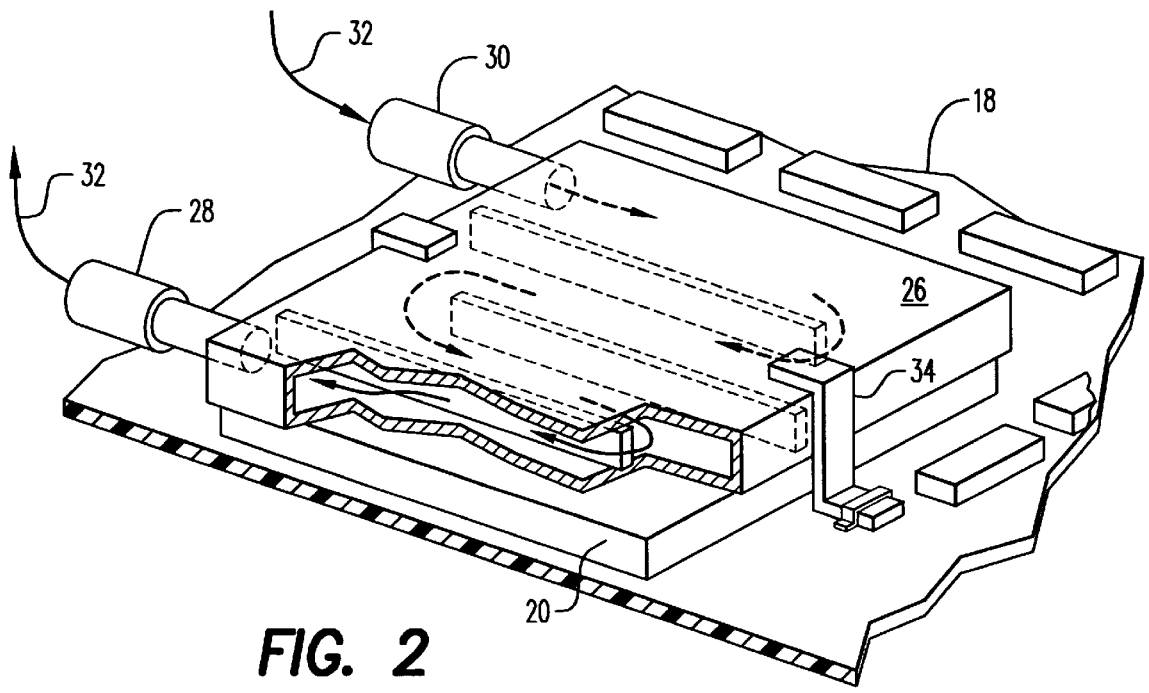
FIG. 2 is a partly sectional, isometric view of the main processor chip shown in FIG. 1, along line 2—2, including a removable heat sink attached thereto for fluid cooling thereof.

The main board 18 is illustrated in part in more detail in FIG. 2 and may have any conventional form in which is removably mounted the central processing unit (CPU) in the form of a main processor chip 20. The main processor chip, or simply processor, may have any conventional configuration and presently operates in the range of 450–550 MHz, for example.

Depending upon the particular type and complexity of the processor 20, different amounts of heat must be suitably dissipated therefrom ranging from as little as about 5 watts up to about 150 watts per processor, for example. In typical personal and laptop computers, a fan is used for circulating ambient air through the cabinets thereof for dissipating the heat from the processors as they operate. However, air cooling has limited capability in computer applications.

As shown in FIGS. 1 and 2, the computer includes a closed loop, hermetically sealed cooling circuit or system 22 specifically configured for maximizing heat dissipation from the processor 20. The circuit includes a pump 24 joined in flow communication with a heat sink or manifold 26 by cooperating inlet and outlet tubes or conduits 28 and 30.

As shown in FIG. 2, a fluid 32 is pumped through the heat sink 26 which sits atop the main processor 20. The fluid 32 may be any suitable liquid, such as a water solution for example, which inherently has substantially greater heat transfer characteristics than ordinary air. By circulating the fluid 32 over the processor 20 during operation, substantially more heat may be dissipated therefrom than using forced air cooling thereof.

Several processors can also be packaged close to each other for high speed communication between them. Heat may be easily extracted therefrom using a liquid coolant. In contrast, much greater separation would be needed using air cooling due to the presence of large heat sinks required therefor.

The relatively small heat sink 26 may have various configurations and is preferably in the form of a manifold having internal flow channels defined by baffles therein, for example, for circulating the fluid 32 therethrough through a corresponding outlet joined to the pump inlet conduit 28, and corresponding inlet joined to the pump outlet conduit 30. The heat sink 26 may be removably attached atop the processor 20 using a pair of spring clips 34. A suitable heat conducting thermal grease or paste may be used between the heat sink 26 and the processor 20 for improving conduction heat transfer therebetween.

Figure 3:
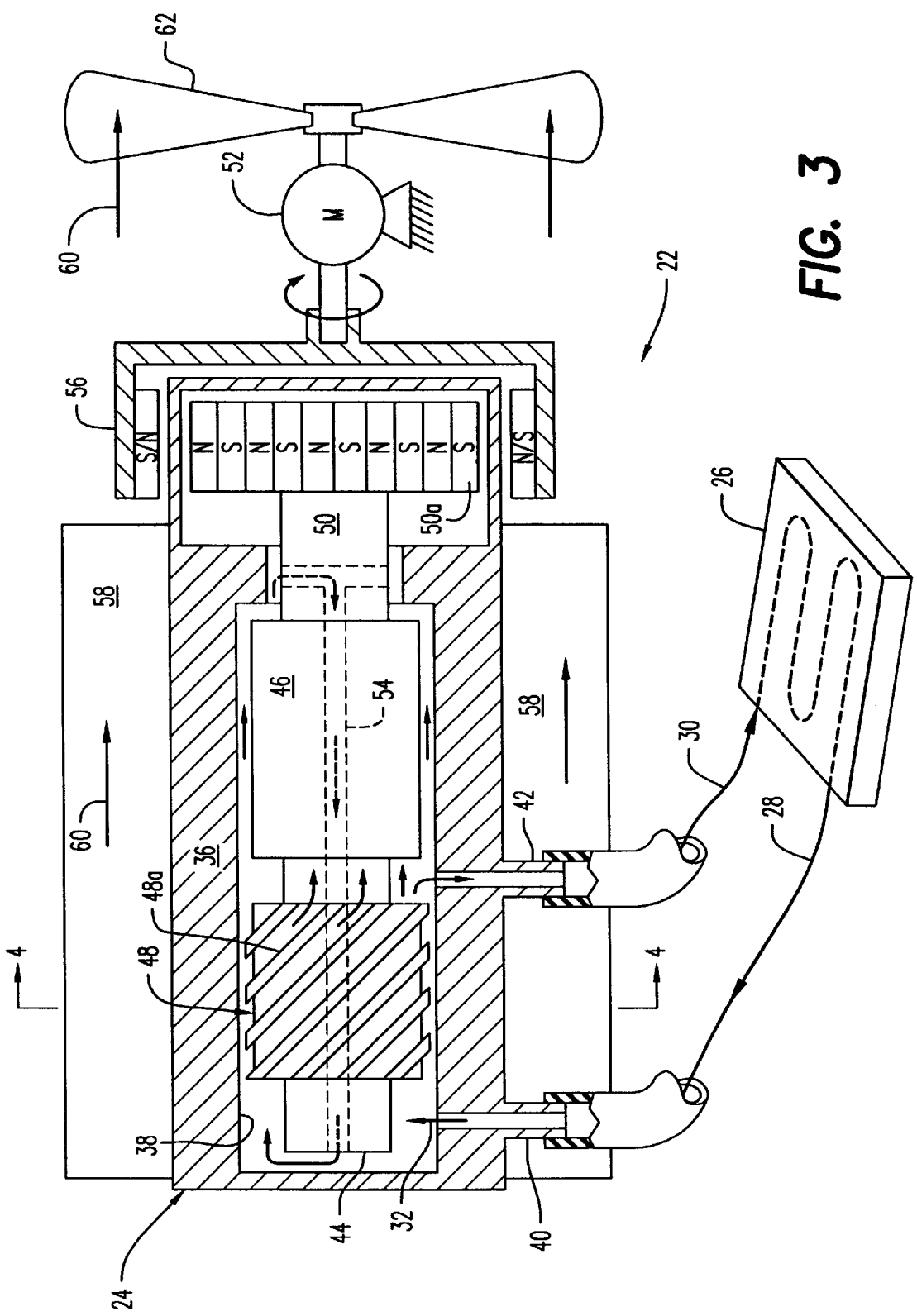
FIG. 3 is a partly sectional, schematic view of the fluid cooling system illustrated in FIG. 1 in accordance with an exemplary embodiment of the present invention.

The cooling system 22 is illustrated schematically in FIG. 3. The pump 24 includes a housing 36 having a central bore 38 disposed therein. The housing includes a side inlet 40 suitably joined to the bore 38 for receiving the cooling fluid, or coolant 32. A housing side outlet 42 is also suitably joined to the bore for discharging the coolant therefrom. The inlet conduit 28 extends from the heat sink 26 to the housing inlet 40, and the outlet conduit 30 extends from the housing outlet 42 to the heat sink 26 to define a closed loop cooling circuit.

A drive shaft 44 is disposed coaxially in the housing bore and is spaced radially inwardly from the inner surface thereof to define a gap therebetween. The shaft 44 includes an integral journal 46, and an integral impeller 48 spaced axially apart therefrom.

In accordance with the present invention, means are provided for hermetically rotating the shaft and integral impeller to pressurize or pump the fluid 32 through the gap from the inlet to outlet, and around the journal 46. The impeller 48 cooperates with the opposing portion of the housing bore 38 for pumping the fluid 32. And, the journal 46 cooperates with the opposing portion of the housing bore 38 for developing a hydrodynamic journal bearing therewith. The same fluid 32 being pumped within the pump 24 is also used for fully supporting the shaft 44 therein for contactless and substantially frictionless operation for maintaining a hermetically sealed housing with substantial long life operation.

The rotating means may take various forms such as an integral rotor 50 extending coaxially from one of the two ends of the shaft 44 inside the housing bore 38. The entire shaft including the journal 46, impeller 48, and rotor 50 is preferably fully enclosed in the housing 36 for providing a sealed or hermetic pump without frictionally engaging bearings therein.

In one embodiment, an electrical motor 52 of any suitable configuration is hermetically joined to the rotor 50 for rotating the shaft to drive the impeller to pump the fluid through the housing during operation.

In the preferred embodiment illustrated in FIG. 3, the housing inlet 40 is disposed on the inlet side of the impeller 48, and the housing outlet 42 is disposed on the outlet side of the impeller for pumping a majority of the fluid therebetween for circulation through the heat sink 26. The journal bearing is defined by the smooth outer surface of the journal 46 and the smooth inner surface of the housing bore 38 spaced therefrom to define a portion of the annular gap which is hydrodynamically pressurized as the journal rotates during operation.

The radial gap of the journal bearing is disposed in flow communication with the impeller in parallel with the housing outlet 42 for receiving a minor portion of the pressurized fluid from the impeller. In this way, the impeller 48 may be sized for pumping a substantial volume of the fluid under suitable pressure for circulation through the heat sink 26, while a small portion of the pump fluid is also pumped through the journal bearing for ensuring hydrodynamic pressure forces. And, such pumping requires no valves, since the impeller alone pumps the fluid unidirectionally through the pump.

The shaft 44 preferably includes a return channel 54 disposed in flow communication with the downstream end of the journal 46 for returning the journal bearing fluid to the inlet side of the impeller 48. The return channel 54 may be in the form of a central bore extending from one end of the shaft 44 to its opposite end adjoining the rotor 50, with radial holes extending outwardly therefrom.

The pressurized fluid circulating over the journal 46 develops hydrodynamic pressure forces for suspending and centering the journal 46 as it rotates during operation for preventing contact with the housing bore. The pressurized fluid may also be used to advantage at any of the several axial faces of the shaft or its components for providing effective axial thrust bearing capability as desired to maintain the shaft and rotor axially centered in the housing and preventing frictional contact between the ends thereof with the housing.

As indicated above, the shaft 44 and integral rotor 50 are preferably fully enclosed inside the housing for maintaining a solid and continuous hermetic seal therearound. The motor 52 must therefore, be magnetically coupled to the rotor 50 for rotation thereof without physical contact therebetween. In an alternate embodiment (not shown), the motor shaft may extend through the housing 36 to directly join the rotor 50, but a suitable rotary seal must be provided therebetween to prevent leakage of the fluid from the housing.

Typical rotary seals are undesirable since they frictionally engage the rotating shaft and are therefore subject to wear. However, a conventional ferrofluid magnetic seal may be used for providing noncontact hermetic sealing of a through shaft directly joined to a motor. The ferrofluid seal creates a magnetic field between the housing and rotor in which Angstrom size iron particles in fluid suspension are trapped. The pumping fluid 32 must therefore be a ferrofluid which is relatively expensive, although providing an effective hermetic seal without frictional contact.

In the exemplary embodiment illustrated in FIG. 3, the rotor 50 includes a plurality of circumferentially adjoining magnetic north and south poles 50a disposed inside the housing 36 for magnetically rotating the rotor 50, and in turn rotating the shaft 44.

In this embodiment, a conventional magnetic coupling 56 is disposed outside the housing 36 and concentrically around the rotor poles 50a. The magnetic coupling 56 is in the exemplary form of a cup or tube having corresponding magnetic poles arranged in a ring therein, with the cup being directly attached to the shaft of the motor 52. The motor 52 is thusly joined to the coupling 56 which in turn is magnetically coupled to the rotor poles 50a so that rotation of the coupling 56 in turn rotates the rotor 50 and attached shaft 44.

Figure 4:
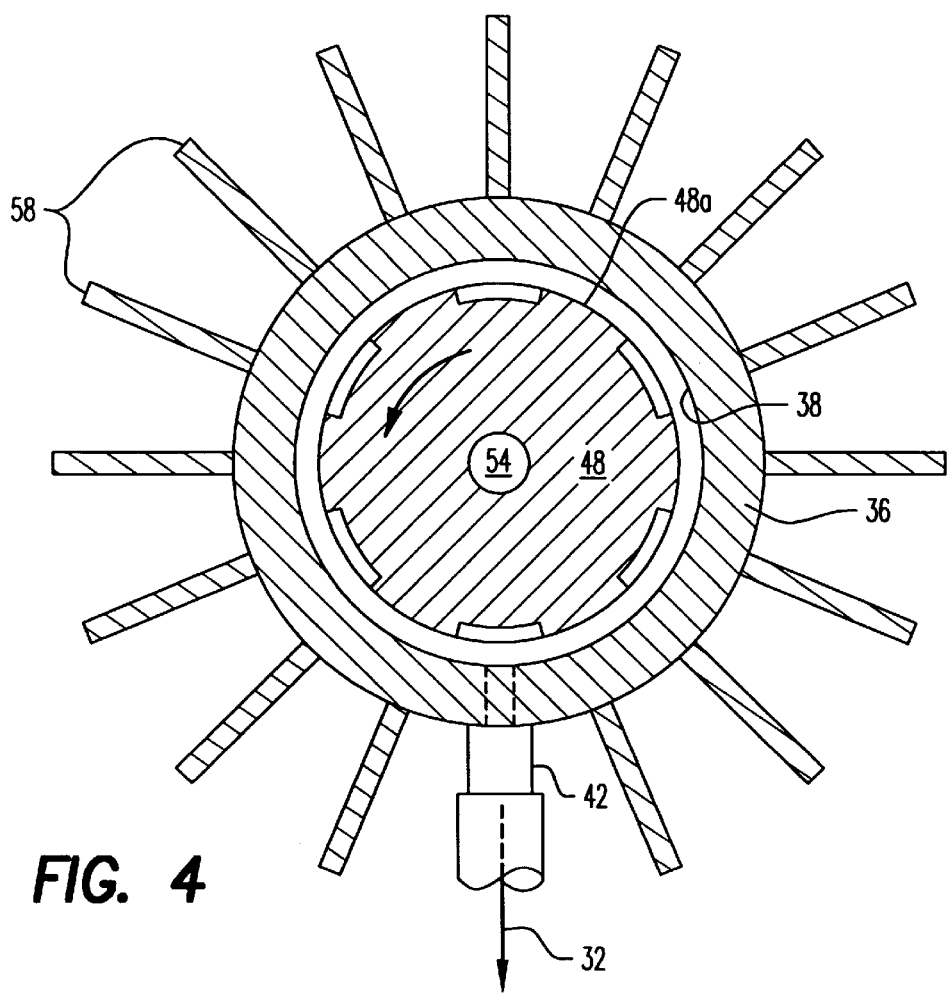
FIG. 4 is a radial sectional view of a portion of the cooling system illustrated in FIG. 3 and taken along line 4—4.

The impeller 48 illustrated in FIG. 3 is in the exemplary form of a screw pump having a plurality of axially spaced apart screw threads 48a for pumping the fluid 32 axially through the gap formed with the housing bore 38. FIG. 4 illustrates in more particularity a sectional view of the impeller 48 including its screw threads 48a which provides an effective screw pump for pressurizing the fluid for pumping through both the journal bearing and the remotely located heat sink 26.

An example of a self pressurizing journal bearing having an integral screw pump, with a ferrofluid magnetic seal on a through shaft is described in more detail in U.S. Pat. No. 5,713,670, incorporated herein by reference. In that patent, the disclosed screw pump was sized for pressurizing solely the bearing fluid for the cooperating journal bearing. In the present invention, however, the screw pump is used for not only pressurizing the fluid in the journal bearing of the hermetic pump, but also providing sufficient recirculation flowrate of the fluid through the heat sink 26 for cooling purposes. Since the heat sink 26 absorbs heat from the processor during operation, that heat must then be suitably removed from the fluid prior its recirculation back through the heat sink. As shown in FIGS. 3 and 4, a suitable radiator 58 in the exemplary form of radiator fins is operatively joined in the cooling circuit for dissipating heat from the fluid as it flows therethrough. The fins 58 preferably extend radially outwardly from the housing 36 for dissipating heat by convection therefrom into ambient air 60.

The radiator may have any conventional form, either integral with the housing or remote therefrom. If integral with the housing, the radiator should have sufficient internal surface area for suitably extracting heat from the coolant fluid. For example, FIG. 5 illustrates a spiral conduit in the housing below the fins for increasing heat transfer and heat extraction from the coolant circulating therethrough.

In this regard, a suitable fan 62 is operatively joined to the common motor 52 at an exposed end of its drive shaft for drawing cooling air 60 over the radiator fins. As shown in FIG. 1, the fan 62 may be suitably located inside the cabinet 16 for discharging air therefrom, with air therein being replaced by ambient room air entering through a suitable louvre 64 mounted in the cabinet. In this way, the cooling air 60 is forced to flow through the cabinet 16 and provides air cooling of the main board 18 as well as cooling of the radiator fins 58 for in turn cooling the coolant 32 circulating through heat sink 26. The liquid cooling of the processor 20 by the heat sink 26 has considerably greater heat dissipation potential than that of forced cooling air.

The cooling circuit 22 illustrated in FIGS. 1–4 is relatively compact and hermetically sealed. Undesirable leakage of the pumping fluid is therefore prevented for ensuring long life operation. The valveless pump pressurizes its own journal bearing and provides contactless operation with minimal friction. The cooling system may therefore have high reliability and long life, and is externally powered by the motor 52. That motor 52 itself may have any suitable design for providing corresponding reliability and long life.

Figure 5:
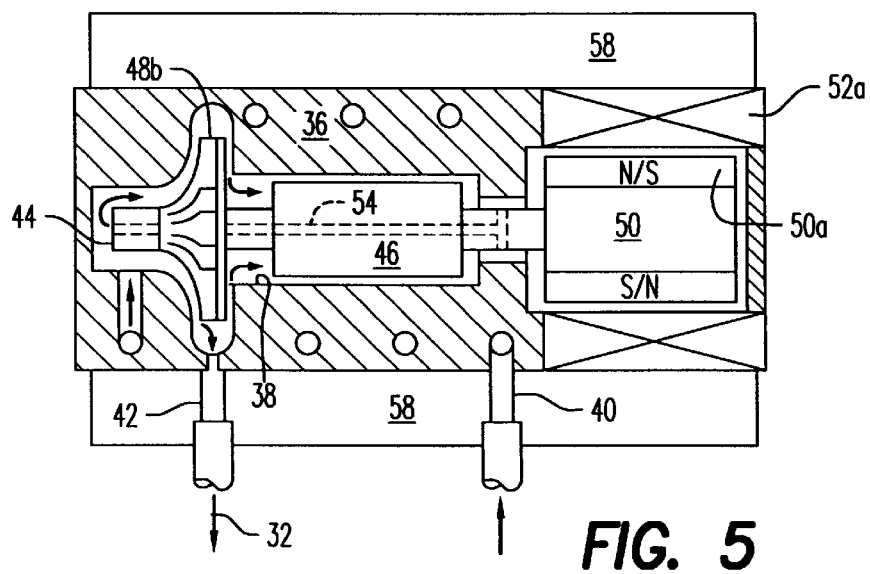
FIG. 5 is a partly sectional, elevational view, like FIG. 3, of a cooling system in accordance with an alternate embodiment of the present invention.

FIG. 5 illustrates schematically an alternate embodiment of the hermetic pump illustrated in FIG. 3. In this embodiment, the driving motor is integrated with the pump and includes a stator or drive coil 52a disposed in a portion of the housing 36 surrounding the rotor 50 for cooperating therewith. The rotor 50 has suitable, circumferentially spaced apart magnetic poles 50a which cooperate with magnetic force generated in the drive coil 52a as it is suitably commutated. The drive coil thusly magnetically cooperates with the rotor for rotation thereof during operation in a fully enclosed housing 36 without contacting friction bearings or through shafts.

FIG. 5 also illustrates an alternate embodiment of the pumping impeller in the form of a centrifugal pump having a plurality of circumferentially spaced apart radial impeller vanes 48b mounted on a backing plate or disk and disposed in a complementary portion of the housing 36, and spaced apart therefrom. As the impeller rotates during operation, the fluid 32 is spun centrifugally outwardly for pressurization thereof for flow through the conduits 28,30 in recirculation through the heat sink 26. A portion of the pressurized fluid may leak around the impeller for feeding fluid to the journal bearing between the journal 46 and the housing bore. The return channel 54 may again extend through the center of the shaft 44 for returning the journal bearing fluid to the inlet side of the impeller for recirculation. Much higher flow rates are possible with a centrifugal pump than with a screw pump, with use of the former ideally suited for kilowatts of cooling capacity.

The improved cooling circuit 22 disclosed above in various embodiments provides a highly reliable, hermetic system for cooling the computer processor 20 with a liquid coolant for substantially increasing heat dissipation therefrom. The cooling system may be relatively compact in view of its greater heat transfer capability than forced air cooling, and may be sized and configured for various applications including the personal computer illustrated, as well as laptop computers and other configurations as desired. The hermetic, self pressurizing pump itself may be used in other applications as desired. The impeller and its supporting shaft are fluidically supported without contacting the surrounding housing for obtaining frictionless operation without leak initiation sites, and without flow valves.

While there have been described herein what are considered to be preferred and exemplary embodiments of the present invention, other modifications of the invention shall be apparent to those skilled in the art from the teachings herein, and it is, therefore, desired to be secured in the appended claims all such modifications as fall within the true spirit and scope of the invention.

Accordingly, what is desired to be secured by Letters Patent of the United States is the invention as defined and differentiated in the following claims in which we claim:

1. A pump comprising:
   a housing having a bore, an inlet joined to said bore for receiving a liquid fluid, and an outlet joined to said bore for discharging said fluid;
   a shaft disposed coaxially in said bore and spaced therein to define a gap therearound, and said shaft has integral portions including a journal, an impeller, and a rotor spaced coaxially apart from each other and hermetically sealed in said housing; and
   means for rotating said rotor to drive said shaft and impeller to pump said fluid through said gap from said inlet to said outlet, and around said journal thereby developing a hydrodynamic journal bearing in said gap around said journal, and said journal bearing being disposed in parallel flow with said housing outlet for receiving a minor portion of said pressurized fluid from said impeller, with a majority portion of said pressurized fluid from said impeller being discharged from said housing outlet.

2. A pump according to claim 1 wherein said rotating means comprise
   a motor magnetically coupled to said rotor for rotating said shaft to drive said impeller to pump said fluid through said housing.

3. A pump according to claim 2 wherein:
   said housing inlet is disposed on an inlet side of said impeller, and said housing outlet is disposed on an outlet side of said impeller for pumping said majority portion of said fluid through said outlet; and
   said journal bearing is disposed on said outlet side of said impeller in parallel flow with said housing outlet for receiving said minor portion of said pressurized fluid from said impeller.

4. A pump according to claim 3 wherein said shaft and rotor are fully enclosed inside said housing, and said motor is magnetically coupled to said rotor for rotation thereof.

5. A pump according to claim 4 wherein said rotor comprises a plurality of circumferentially adjoining poles for being magnetically rotated by said motor.

6. A pump according to claim 5 further comprising a magnetic coupling disposed outside said housing and surrounding said rotor, and said motor is joined to said coupling for rotating said rotor.

7. A pump according to claim 5 wherein said motor includes a drive coil disposed in said housing for magnetically cooperating with said rotor for rotation thereof.

8. A pump according to claim 4 wherein said impeller comprises a screw pump having a plurality of axially spaced apart screw threads for pumping said fluid.

9. A pump according to claim 4 wherein said impeller comprises a centrifugal pump having a plurality of circumferentially spaced apart impeller vanes disposed in a complementary portion of said housing.

10. A pump according to claim 4 in combination with:

a heat sink;

an inlet conduit extending from said heat sink to said housing inlet; and an outlet conduit extending from said heat sink to said housing outlet thereby defining a closed loop cooling circuit.

11. A Pump in combination with said cooling circuit according to claim 10 further comprising a radiator operatively joined therein for dissipating heat from said fluid as it flows through said circuit.

12. A pump in combination with said cooling circuit according to claim 11 wherein said radiator comprises a plurality of fins extending outwardly from said housing for dissipating heat by convection therefrom.

13. A pump in combination with said cooling circuit according to claim 12 in further combination with a computer including a cabinet containing a main circuit board having a central processor unit chip thereon, and said cooling circuit is disposed inside said cabinet, with said heat sink mounted atop said chip for liquid cooling thereof by said fluid circulating through heat sink.

14. A pump in combination with said cooling circuit and computer according to claim 13 further comprising a fan operatively joined to said motor inside said cabinet for drawing air over said radiator for air cooling thereof.

* * * * *